(12) United States Patent
Debregeas-Sillard et al.

(10) Patent No.: US 9,160,143 B2
(45) Date of Patent: Oct. 13, 2015

(54) TUNABLE LASER EMISSION DEVICE

(71) Applicants: Commissariat a l'Engerie Atomique et aux Energies Alternatives, Paris (FR); Alcatel Lucent, Boulogne-Billancourt (FR)

(72) Inventors: Helen Debregeas-Sillard, Le Chesnay (FR); Badhise B. Bakir, Grenoble (FR); Guang-Hua Duan, Sceaux (FR); Nicolas Chimot, Bruyeres le Chatel (FR)

(73) Assignees: Commissariat a l'Engerie Atomique et aux Energies Alternatives (FR); Alcatel Lucent (FR)

( * ) Notice: Subject to any disclaimer, the term of this patent is extended or adjusted under 35 U.S.C. 154(b) by 0 days.

(21) Appl. No.: 14/295,580

(22) Filed: Jun. 4, 2014

(65) Prior Publication Data
US 2014/0369700 A1 Dec. 18, 2014

(30) Foreign Application Priority Data
Jun. 7, 2013 (EP) .................... 13305766

(51) Int. Cl.
| | |
|---|---|
| H01S 5/22 | (2006.01) |
| H04B 10/50 | (2013.01) |
| H01S 5/062 | (2006.01) |
| H01S 5/026 | (2006.01) |
| H01S 5/10 | (2006.01) |
| H01S 5/06 | (2006.01) |
| H01S 5/02 | (2006.01) |
| H01S 5/12 | (2006.01) |

(52) U.S. Cl.
CPC ............... *H01S 5/2226* (2013.01); *H01S 5/026* (2013.01); *H01S 5/0614* (2013.01); *H01S 5/0622* (2013.01); *H01S 5/1032* (2013.01); *H04B 10/503* (2013.01); *H01S 5/021* (2013.01); *H01S 5/1203* (2013.01)

(58) Field of Classification Search
CPC ....... H01S 5/021; H01S 5/026; H01S 5/0614; H01S 5/06206; H01S 5/0622; H01S 5/06255; H01S 5/1032; H01S 5/1203; H01S 5/2226; H01L 21/02; H01L 21/02038; H01L 21/041
See application file for complete search history.

(56) References Cited

U.S. PATENT DOCUMENTS

2005/0265679 A1   12/2005   Liu et al.

OTHER PUBLICATIONS

Stankovic S. et al., "Hybrid III V/SI Distributed-Feedback Laser Based on Adhesive Bonding", IEEE Photonics Technology Letters, IEEE Service Center, Piscataway, NJ, vol. 24, No. 23 Dec. 1, 2012, pp. 2155-2158.

(Continued)

*Primary Examiner* — Armando Rodriguez
(74) *Attorney, Agent, or Firm* — Blank Rome LLP

(57) ABSTRACT

A wavelength tunable laser emission device (1) comprises: a first waveguide (31) comprising an optical amplification means for producing a stimulated light emission, the first waveguide extending in a longitudinal direction of the emission device, a second waveguide (5) made of silicon on silicon dioxide and disposed parallel to the first waveguide spaced from the first waveguide in a vertical direction of the emission device so as to allow the existence of a hybrid optical mode coupled at one and the same time to the second waveguide and to the first waveguide, the second waveguide comprising a distributed reflector (9) along the second waveguide, the second waveguide comprising transverse zones (11, 12, 13, 14) doped differently so as to form a polar junction oriented in a transverse direction of the emission device. Electrodes (15, 16) coupled to the doped transverse zones modify an effective index seen by the hybrid optical mode.

16 Claims, 6 Drawing Sheets

(56) References Cited

OTHER PUBLICATIONS

Di Liang et al, "Hybrid Silicon Evanescent Approach to Optical Interconnects", Applied Physics A; Materials Science & Processing, Springer, Berlin, De, vol. 95, No. 4, Feb. 19, 2009, pp. 1045-1057.

Linjie Zhou et al., "Silicon-on-insulator electro-optically tunable waveguide-coupled microdisk resonators with selectively integrated p-i-n diodes", Group IV Photonics, 2005. NUD IEEE International Conference on Antwerpen, Belgium, Sep. 21-23, 2005, Piscataway, NJ, pp. 23-25.

Fedeli J M et al., "Silicon Photonics with InP on Si lasers for transceivers", Opto-Electronics and Communications Conference (OECC), 2012 17th, IEEE, Jul. 2, 2012, pp. 291-292.

Reed, G T et al., "Silicon Optical Modulators", Materials Today, Elsevier Science, Kidlington, GB, vol. 8, No. 1, Jan. 1, 2005, pp. 40-50.

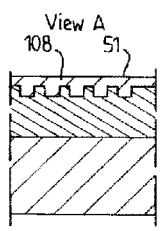
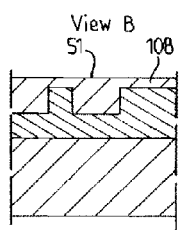
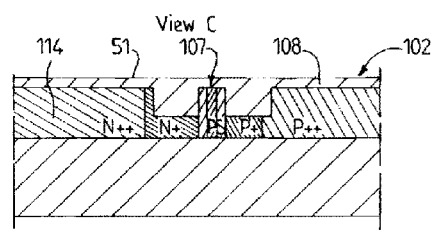
FIG.16  FIG.17  FIG.18
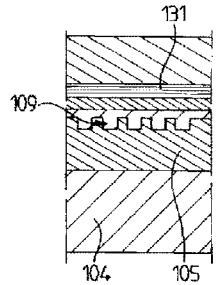
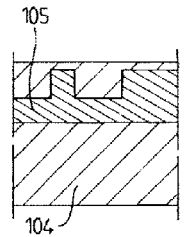
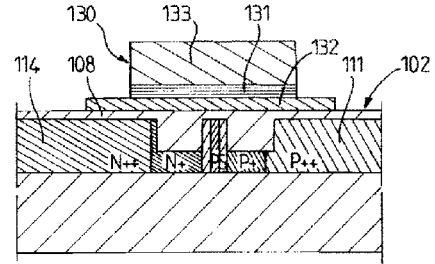
FIG.19  FIG.20  FIG.21

TUNABLE LASER EMISSION DEVICE

REFERENCE TO RELATED APPLICATIONS

The present application claims benefit to European Patent Application No. 13305766.1 filed Jun. 7, 2013, the contents of which are hereby incorporated by reference in its entirety into the present disclosure.

TECHNICAL FIELD

The invention pertains to the field of wavelength tunable semi-conductor laser emission devices, in particular to a laser source usable in optical communications, and in particular in a wavelength division multiplexing (WDM) optical network.

TECHNOLOGICAL BACKGROUND

Known tunable laser sources are, in particular, Bragg reflector (or DBR standing for Distributed Bragg Reflector) lasers in which the adjustment of the emitted wavelength entails a modification of a phase condition of the longitudinal modes of the DBR cavity. This then results in discontinuous tunability with mode jumps. A phase section of the laser source makes it possible to precisely align a resonant mode of the cavity on the desired wavelength. This results in a device which is relatively complex to adjust, in which a control current for the gain section, at least one control current for the distributed reflector or reflectors and a control current for the phase section must be adjusted simultaneously.

In another solution called a Tunable Twin-Guide (TTG) laser, an active layer of InGaAsP material is situated above a passive Bragg grating of InGaAsP material. Independent control currents are injected, on the one hand into the active layer to adjust the gain, and on the other hand into the passive Bragg grating to adjust the wavelength. Given that the Bragg grating, whose effective index can be modified by current injection, is situated directly in the amplification zone, the resonant modes of the DFB (distributed feedback) type are shifted by the very effect of this adjustment without a phase section being necessary. The wavelength tunability is continuous without any jump of modes.

SUMMARY

An idea underlying the invention is to provide a tunable laser emission device having a relatively wide adjustment span and relatively simple control. Another idea underlying the invention is to provide a reliable fabrication process for such a laser emission device.

According to one embodiment, the invention provides a wavelength tunable laser emission device, comprising:

a first waveguide comprising an optical amplification means for producing a stimulated light emission, the first waveguide extending in a longitudinal direction of the emission device, a second waveguide made of silicon on silicon dioxide and disposed parallel to the first waveguide spaced from the first waveguide in a vertical direction of the emission device so as to allow the existence of a hybrid optical mode coupled at one and the same time to the second waveguide and to the first waveguide, the second waveguide comprising a distributed reflector along the second waveguide, the second waveguide also comprising transverse zones doped differently so as to form a polar junction oriented in a transverse direction of the emission device, first electrodes coupled to the first waveguide for injecting a pumping current into the optical amplification means, and second electrodes coupled to the doped transverse zones of the second waveguide so as to modify an effective index of the second waveguide seen by the hybrid optical mode.

The two waveguides form a complete system in which hybrid modes exist. The hybrid optical mode used is preferably confined especially in the first waveguide, but it also extends to the second waveguide so as to be able to experiment with the periodic variation in the index of materials which is created by the distributed reflector, for example a Bragg grating.

By virtue of these characteristics, it is possible to control this propagative hybrid mode at one and the same time in the first waveguide furnished with the amplification means and in the second waveguide furnished with the distributed reflector, so that an adjustment of the gain and of the wavelength by means of two independent electrical controls can be obtained without a phase section being necessary.

Moreover, the second waveguide made of silicon on silicon dioxide is furnished with a distributed reflector along the longitudinal direction and differently doped transverse zones forming a polar junction oriented according to the transverse direction. The choice of the silicon material gives access to reliable and relatively economical fabrication techniques therefor. The injection of current or the application of an electrical voltage in the second waveguide can thus be implemented in a relatively simple manner.

According to embodiments, such a laser emission device can comprise one or more of the following characteristics.

According to embodiments, the second waveguide comprises an extraction zone for radiating the light of the resonating mode out of the laser emission device, or else the second waveguide is coupled directly to another optical component also integrated on the same substrate.

According to one embodiment, the first waveguide is made of an active material from group III-V. In particular, the first waveguide can be fabricated by the steps of:

adhesively bonding a patch or a wafer of materials from group III-V on a silicon on insulator wafer, in which the second waveguide has been etched and previously implanted, and making the first waveguide in the patch or wafer of materials from group III-V, this first waveguide being aligned with the second waveguide by optical lithography.

According to another embodiment, the first waveguide is made of a doped germanium alloy. A strongly doped and strained germanium alloy can exhibit a high optical gain. In this case, the first waveguide can be fabricated by a method of epitaxy directly on the second waveguide.

According to one embodiment, a silicon dioxide layer of small thickness is disposed between the second waveguide and the first waveguide. This layer is optional and it can facilitate the adhesive bonding of the components. According to one embodiment, the silicon dioxide layer of small thickness exhibits a thickness of less than 100 nm.

According to embodiments, the polar junction is of P—N type or of P—I—P—I—N type.

According to one embodiment, the polar junction comprises a first external transverse zone strongly doped positively and a second external transverse zone strongly doped negatively, the second electrodes being disposed respectively on the two strongly doped external transverse zones.

According to one embodiment, the distributed reflector exhibits a coupling coefficient of between 10 $cm^{-1}$ and 200 $cm^{-1}$.

According to one embodiment, the second waveguide made of silicon on silicon dioxide exhibits a thickness of between 400 nm and 600 nm.

According to embodiments, the distributed reflector can be periodic of constant period, or exhibit several periodic sections of different periods, or else exhibit a variable spacing along its length. The distributed grating can also comprise different etching thicknesses on several sections.

According to one embodiment, the distributed reflector can be of dimensionality 1 (e.g.: network of lines) or 2 (e.g.: network of holes or bumps, square or circular). When the network is of dimensionality 2, the mesh may be square or triangular. The various embodiments cited for the 1D network are applicable to 2D networks.

According to one embodiment, the second waveguide comprises two sampled gratings of different period. A sampled grating comprises a certain number of the periodic zones corresponding to a spatial sampling period, which is different in the two sampled gratings. In each of the zones corresponding to the sampling period, the sampled grating is etched solely over a portion of the length of the period, with a shorter second spatial period which may be equal in the two sampled gratings.

According to one embodiment, the device furthermore comprises an optical reflector element arranged at a longitudinal end of the device so as to permit the light to be extracted solely through the other longitudinal end of the device, and/or to ensure proper single-mode operation of the device.

According to one embodiment, the invention also provides an optical communication terminal comprising:

an aforementioned tunable laser emission device for generating a monochromatic optical carrier signal, an optical modulator for modulating a data signal on the carrier signal, a temperature sensor, and a wavelength stabilization module coupled to the second electrodes of the laser emission device so as to apply an electrical control signal in the second waveguide, for example a current or a voltage, the wavelength stabilization module being able to produce the control signal as a function of a measurement signal of the temperature sensor so as to compensate a thermal drift of the wavelength of the optical carrier signal.

By virtue of these characteristics, the optical communication terminal does not require an air-conditioned or cooled environment, given that the wavelength emitted can be stabilized in a simple manner, without any mode jump, as a function of the temperature measurement when the ambient temperature varies. This results in the possibility of offering an optical communication terminal suitable for a WDM network, for example for a passive access network, which is very advantageous in terms of energy consumption, cost of fabrication and simplicity of use.

According to one embodiment, the invention also provides a fabrication process for fabricating a wavelength tunable laser emission device, the process comprising:

making a second monolithic optical component comprising a second waveguide made of silicon on silicon dioxide and extending in a longitudinal direction of the second monolithic optical component, the second waveguide comprising a distributed reflector along the second waveguide, the second waveguide comprising differently doped transverse zones so as to form a polar junction oriented in a transverse direction of the second optical component, the second monolithic optical component comprising a superficial silicon dioxide layer of small thickness covering the second waveguide at the level of an upper surface of the second optical component, adhesively bonding a first monolithic optical component made of material from group III-V on the upper surface of the second optical component, the first monolithic optical component comprising a light-amplifying guiding layer, making a first waveguide in the first monolithic optical component, the first waveguide being made by lithography in a manner aligned with the second waveguide, forming on the first monolithic optical component first electrodes for controlling the optical amplification gain, and forming on the second monolithic optical component second electrodes coupled to the doped transverse zones of the second waveguide so as to modify an effective index of the second waveguide.

According to one embodiment, the adhesive bonding of the first monolithic optical component on the upper surface of the second optical component is carried out by pressurization, preferably with the aid of a polymer adhesive.

According to one embodiment, the first optical component is a patch or a wafer of materials from group III-V which comprises a light-amplifying guiding layer and the second optical component is a silicon on insulator wafer in which the second guide has been etched previously.

According to embodiments, other steps can also be carried out after the adhesive bonding, for example encapsulation of the first waveguide, metallization to form electrodes to make it possible to control the amplification gain, and local elimination of the adhesively bonded III-V substances so as thereafter to deposit metallic layers forming the second electrodes on the second waveguide.

BRIEF DESCRIPTION OF THE FIGURES

The invention will be better understood, and other aims, details, characteristics and advantages thereof will become more clearly apparent in the course of the following description of several particular embodiments of the invention, which are given solely by way of nonlimiting illustration with reference to the appended drawings.

FIG. 16 partially represents, at a fifth step of the fabrication of the other embodiment of the tunable laser source, a view A corresponding to zone A of the device of FIG. 3, as the process goes on with a chemical and mechanical step in which the silicon dioxide layer is eliminated and polished.

FIG. 17 partially represents, at the fifth step of the fabrication of the other embodiment of the tunable laser source, a view B corresponding to zone B of the device of FIG. 3, as the process goes on with the chemical and mechanical step in which the silicon dioxide layer is eliminated and polished.

FIG. 18 partially represents, at the fifth step of the fabrication of the other embodiment of the tunable laser source, a view C corresponding to zone C of the device of FIG. 1, as the process goes on with the chemical and mechanical step in which the silicon dioxide layer is eliminated and polished.

FIG. 19 partially represents, at a sixth step of the fabrication of the other embodiment of the tunable laser source, a view A corresponding to zone A of the device of FIG. 3, as the process goes on with an adhesive bonding stage of a second monolithic optical component.

FIG. 20 partially represents, at the sixth step of the fabrication of the other embodiment of the tunable laser source, a view B corresponding to zone B of the device of FIG. 3, as the process goes on with the adhesive bonding stage of a second monolithic optical component.

FIG. 21 partially represents, at the sixth step of the fabrication of the other embodiment of the tunable laser source, a view C corresponding to zone C of the device of FIG. 1, as the process goes on with the adhesive bonding stage of a second monolithic optical component.

DETAILED DESCRIPTION OF EMBODIMENTS

Figure 1:
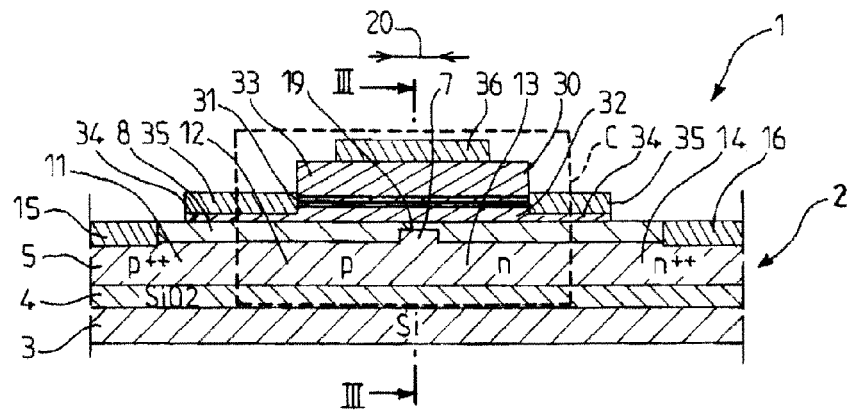
FIG. 1 is a transverse sectional view of a distributed feedback (DFB) laser source according to an embodiment, sectioned along the line I-I of FIG. 3.
Figure 2:
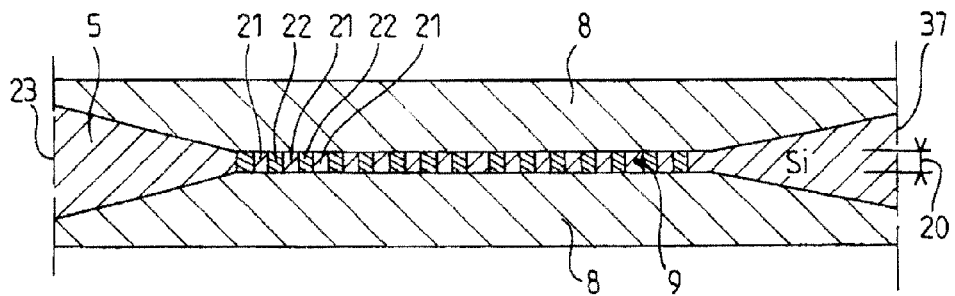
FIG. 2 is a sectional view of the device of FIG. 1 along the line II-II in FIG. 3.
Figure 3:
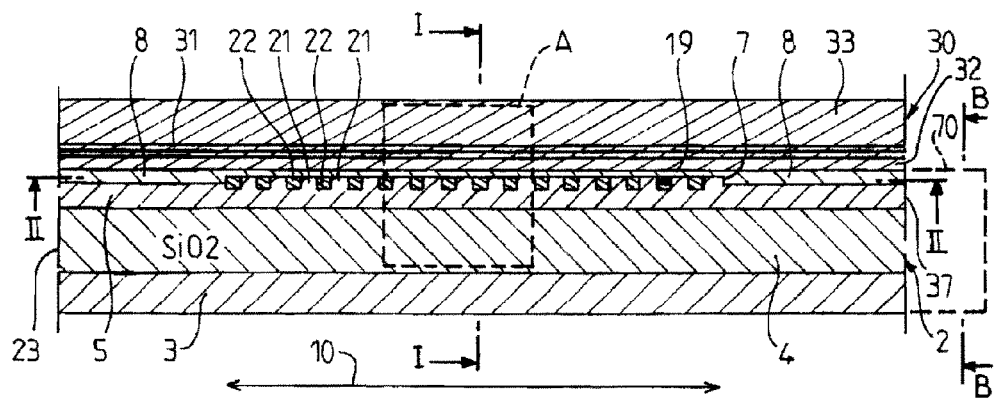
FIG. 3 is a longitudinal sectional view of the device of FIG. 1 along the line III-III in FIG. 1.

With reference to FIGS. 1 to 3, a semi-conductor laser source 1 represented in various sectional views is now described. Starting from the bottom of the figures, the laser source comprises a semi-conductor optical guide 2, made of silicon on insulator (SOI) and consisting of a silicon base layer 3, a base layer 4 of silicon dioxide SiO2, stated otherwise silica, and a silicon guiding layer 5, and optionally a silica layer 8. The interfaces between layers are plane and parallel. The direction in which these layers follow one another is called the vertical direction, it being understood that this conventional labeling does not necessarily correspond to the direction of the terrestrial gravitational field.

In a central portion 10 of the length of the laser 1, the silicon guiding layer 5 comprises several successive zones in the transverse direction which are doped differently to form a P—N junction, namely from left to right in FIG. 1, a strongly positively doped longitudinal band 11, a positively doped longitudinal band 12, a negatively doped longitudinal band 13 and a strongly negatively doped longitudinal band 14. On a lateral end portion, the longitudinal band 11 carries a metallization 15 deposited on the silicon guiding layer 5. Likewise, on a lateral end portion, the longitudinal band 14 carries a metallization 16 deposited on the silicon guiding layer 5. The metallizations 15 and 16 serve as electrode for applying an electrical signal to the P—N junction, thereby making it possible to modify the optical index of the silicon guiding layer 5, and therefore of the diffraction grating which is etched at its center.

In a central portion 20 of the width of the laser 1, the silicon guiding layer 5 comprises an upward projecting narrow rib 7, of small width with respect to the guiding layer 5 as a whole. A diffraction grating 9 is etched in the rib 7 along the longitudinal direction of the guiding layer 5. The diffraction grating 9 comprises a periodic alternation of silicon zones 21 and of silica zones 22. The diffraction grating 9 constitutes a distributed reflector which produces an optical cavity of the DFB type.

A totally reflecting coating 23 covers a longitudinal end surface of the laser 1. The other end 37 bears a semi-reflecting coating and constitutes the laser beam exit.

In a variant embodiment sketched dashed in FIG. 3, the laser 1 is coupled at the end 37 with another integrated optical component 70 on the same substrate as the laser 1, for example an optical modulator, a coherent receiver or any other optical component usable with a laser source. In this case, the waveguide 2 is extended into the optical component 70, so that the laser 1 does not directly have an exit to the outside. The semi-reflecting coating on the end 37 is then removed.

Between the metallizations 15 and 16, the silicon guiding layer 5 is covered over the whole of its width, including the narrow rib 7, with a silica layer 8. The silica layer 8 comprises a portion of small thickness 19 above the diffraction grating 9. Thus, the upper surface of the silica layer 8 is plane and parallel to the interface between the layers 4 and 5.

On the upper surface of the silica layer 8 is disposed a second semi-conductor optical guide 30, made for example of materials from group III-V, which comprises a multilayer structure having an active guiding layer 31 disposed between two passive layers 32 and 33, for example an InP/InGaAsP/InP stack.

The waveguide 30 extends longitudinally over the whole of the length of the waveguide 2, or at least beyond the central portion 10 of the waveguide 2. In the transverse direction of the laser 1, the waveguide 30 is wider than the waveguide 2.

The lower passive layer 32 of the waveguide 30 exhibits two lateral wings 34 widening beyond the edges of lateral ends of the active guiding layer 31 and of the upper passive layer 33. The two wings 34 are covered with a metallization 35 while the upper surface of the layer 33 is covered with a metallization 36. The metallizations 35 and 36 serve as electrode for applying an electrical pumping signal to the active material to create the population inversion.

The dimensioning of the various parts of the laser 1 is performed in such a way that there exists an optical coupling between the guiding layer 5 and the active guiding layer 31, which gives rise to a hybrid resonating optical mode whose energy is distributed both in the guiding layer 5 and in the active guiding layer 31, thereby making it possible to benefit both from the amplification produced in the active guiding layer 31 and from the wavelength selection produced by the diffraction grating 9 in the guiding layer 5.

The coupling coefficient of the diffraction grating 9 is preferably in the span from 10 to 200 cm$^{-1}$ so as to obtain high efficiency of the laser 1 in single-mode operation. In one embodiment, the guiding layer 5 exhibits a thickness of 440 nm at the rib 7 and the projecting height of the rib is 220 nm, the diffraction grating 9 being etched over a depth of 50 nm in the height of the rib 7.

Figure 25:
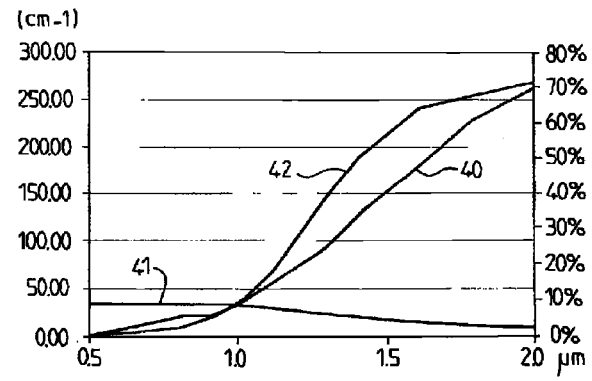
FIG. 25 is a graph representing the evolution of various characteristics of the laser source of FIG. 1 as a function of the width of the silicon waveguide.

FIG. 25 represents, for this embodiment of the grating 9, the coupling coefficient of the grating on the curve 40, the confinement factor of the optical mode in the active material layer 31 on the curve 41, and the confinement factor of the optical mode in the silicon layer 5 on the curve 42, as a function of the width of the rib 7 expressed in μm. Thus, by way of illustration, a coupling coefficient of between 20 and 100 cm$^{-1}$, a confinement factor in the gain medium of between 6 and 8% and a confinement factor in the silicon of between 2 and 40% are obtained for a rib of between 0.8 and 1.2 μm in width.

Preferably, the confinement factor in the silicon is greater than 10% so that the variation in optical index in the layer 5 has a substantial effect on the hybrid optical mode. For a confinement factor in the silicon situated around 30%, given that the maximum variation in the silicon index that it is possible to obtain by injecting current into the P—N junction is of the order of 5×10$^{-2}$, the width of the wavelength tuning span may be estimated at about 10 nm.

The variation in the effective index $n_{eff}$ seen by the hybrid optical mode is obtained as a consequence of the injection of current or of the application of a voltage in the silicon, given that the effective index of the diffraction grating is a weighted average of the respective indices of the materials silicon, silicon dioxide and the material from group III-V, where the weighting coefficient is the confinement factor for the electromagnetic field intensity of the hybrid mode in the various layers.

The Bragg wavelength seen by the hybrid mode is given by:

$$\lambda = 2 n_{eff} \cdot \Lambda$$

Where Λ denotes the spacing of the diffraction grating 9.

As a variant, the variation in index can be caused by thermal effect, injection of carriers or depletion of carriers.

With reference to FIGS. 4 to 24, another embodiment of a tunable laser source and its fabrication process will now be described. The elements which are analogous or identical to those of FIGS. 1 to 3 bear the same reference numeral increased by 100. In this embodiment, the above-mentioned P—N junction is replaced with a P—I—P—I—N junction.

In FIGS. 4 to 24, three views A, B and C are represented at each step of the fabrication process. View A corresponds to zone A of FIG. 3, namely the middle of the device seen in longitudinal section, at each successive step of the process represented with reference to FIGS. 4, 7, 10, 13, 16, 19 and 22. View B corresponds to the section B-B of FIG. 3, namely an optical component integrated on the same substrate as the laser and seen in transverse section, at each successive step of the process represented with reference to FIGS. 5, 8, 11, 14, 17, 20 and 23. View C corresponds to zone C of FIG. 1, namely the middle of the device seen in transverse section, at each successive step of the process represented with reference to FIGS. 6, 9, 12, 15, 18, 21 and 24.

Figure 4:
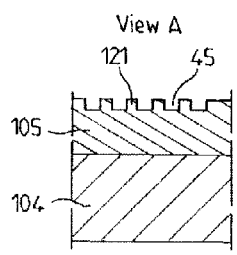
FIG. 4 partially represents, at a first step of a fabrication of another embodiment of a tunable laser source, a view A corresponding to zone A of the device of FIG. 3, as the process starts from an etching of an insulator die.
Figure 5:
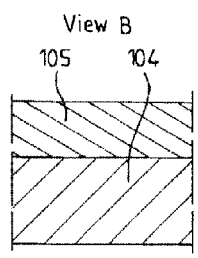
FIG. 5 partially represents, at the first step of the fabrication of the other embodiment of the tunable laser source, a view B corresponding to zone B of the device of FIG. 3, as the process starts from the etching of an insulator die.
Figure 6:
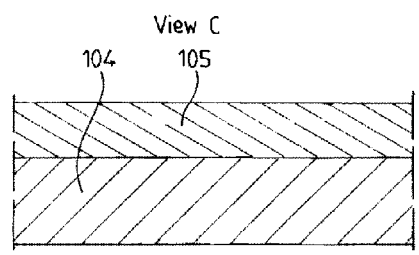
FIG. 6 partially represents, at the first step of the fabrication of the other embodiment of the tunable laser source, a view C corresponding to zone C of the device of FIG. 1, as the process starts from the etching of an insulator die FIG. 7 partially represents, at a second step of the fabrication of the other embodiment of the tunable laser source, a view A corresponding to zone A of the device of FIG. 3, as the process goes on with a doping of the silicon layer.

In FIGS. 4, 5 and 6 the process starts from a silicon on insulator die (silicone) whose thickness is preferably greater than 400 nm. The top of the silicon layer 105 is etched with a succession of teeth 121 and with troughs 45 to form the Bragg grating 109 which will define the resonant wavelengths of the laser.

Figure 7:
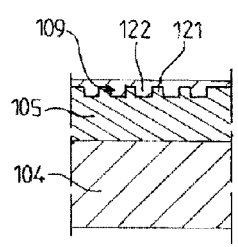
Figure 8:
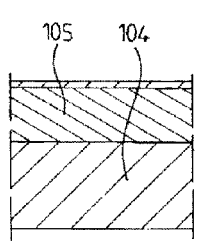
FIG. 8 partially represents, at the second step of the fabrication of the other embodiment of the tunable laser source, a view B corresponding to zone B of the device of FIG. 3, as the process goes on with the doping of the silicon layer.
Figure 9:
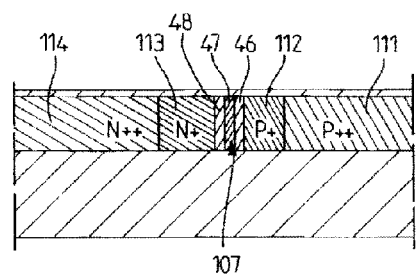
FIG. 9 partially represents, at the second step of the fabrication of the other embodiment of the tunable laser source, a view C corresponding to zone C of the device of FIG. 1, as the process goes on with the doping of the silicon layer.

In FIGS. 7, 8 and 9, adjacent transverse zones 111, 112, 46, 47, 48, 113 and 114 of the silicon layer 105 are doped to form the P—I—P—I—N junction, namely from right to left in FIG. 9, a strongly positively doped longitudinal band 111, a positively doped longitudinal band 112, a central junction zone 50 comprising a narrow positively doped band 47 between two undoped silicon bands 46 and 48, a negatively doped longitudinal band 113 and a strongly negatively doped longitudinal band 114. The positive doping is performed for example by implantation of boron atoms, and the negative doping by implantation of phosphorus atoms. A silicone deposition is performed to fill in the troughs 45.

Figure 10:
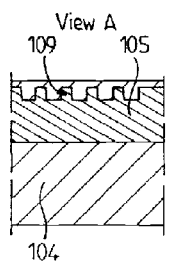
FIG. 10 partially represents, at a third step of the fabrication of the other embodiment of the tunable laser source, a view A corresponding to zone A of the device of FIG. 3, as the process goes on with a delimitation of the waveguides.
Figure 11:
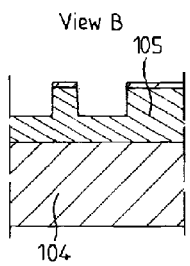
FIG. 11 partially represents, at the third step of the fabrication of the other embodiment of the tunable laser source, a view B corresponding to zone B of the device of FIG. 3, as the process goes on with the delimitation of the waveguides.
Figure 12:
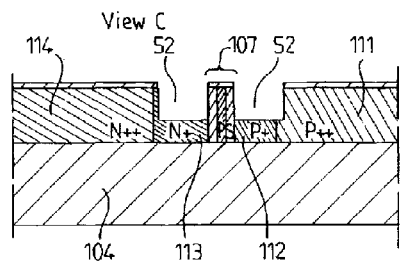
FIG. 12 partially represents, at the third step of the fabrication of the other embodiment of the tunable laser source, a view C corresponding to zone C of the device of FIG. 1, as the process goes on with the delimitation of the waveguides.

In FIGS. 10, 11 and 12, the guiding silicon layer 105 is partially eliminated from each side of the central zone 107 to form channels 52 intended to delimit waveguides and to leave the central zone 107 projecting in the form of a rib.

Figure 13:
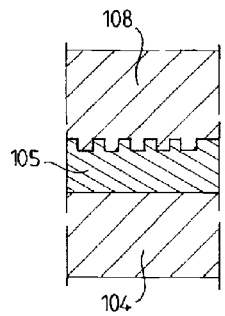
FIG. 13 partially represents, at a forth step of the fabrication of the other embodiment of the tunable laser source, a view A corresponding to zone A of the device of FIG. 3, as the process goes on with a deposition of a silicon dioxide layer.
Figure 14:
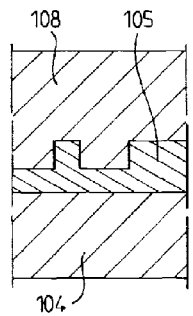
FIG. 14 partially represents, at the forth step of the fabrication of the other embodiment of the tunable laser source, a view B corresponding to zone B of the device of FIG. 3, as the process goes on with the deposition of a silicon dioxide layer.
Figure 15:
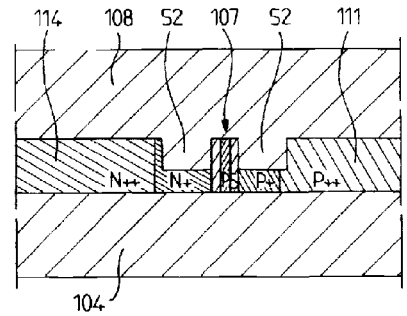
FIG. 15 partially represents, at the forth step of the fabrication of the other embodiment of the tunable laser source, a view C corresponding to zone C of the device of FIG. 1, as the process goes on with the deposition of a silicon dioxide layer.

In FIGS. 13, 14 and 15, a thick silicon dioxide layer 108, preferably greater than 0.5 μm, is deposited over the whole of the layer 105 and thus fills the channels 52.

In FIGS. 16, 17 and 18, the thick silicon dioxide layer 108 is eliminated and polished in a chemical and mechanical manner until a fine layer 108 of silicon dioxide with a very smooth surface state is left on the upper surface 51. The remaining thickness is preferably between 30 nm and 100 nm above the central rib 107. The silicon dioxide layer 108 can also be completely removed without appreciable consequence for the operation of the device.

In FIGS. 19, 20 and 21, a second monolithic optical component 130 fabricated separately from a material from group III-V comprises the active guiding layer 131 disposed between two passive layers 132 and 133. The component 130 is assembled by adhesive bonding on the upper surface 51 of the previously obtained component 102. The adhesive bonding of the component 130 on the component 102 is performed for example at ambient temperature with pressurization or with the aid of a DVS-BCB polymer adhesive. At the adhesive bonding stage, the optical component 130 is a patch or a wafer of materials from group III-V. A step of photolithography and etching in the wafer of materials from group III-V is undertaken thereafter to produce a waveguide aligned with the waveguide formed in the channels 52 of the component 102.

Figure 22:
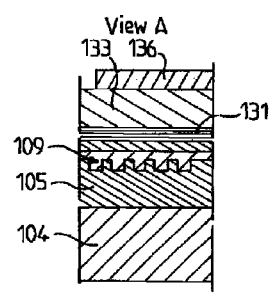
FIG. 22 partially represents, at a seventh step of the fabrication of the other embodiment of a tunable laser source, that is a metallization step, a view A corresponding to zone A of the device of FIG. 3.
Figure 23:
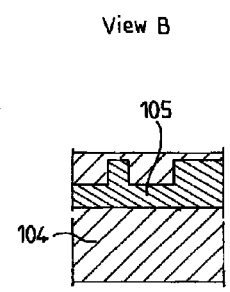
FIG. 23 partially represents, at the seventh step of the fabrication of the other embodiment of a tunable laser source, that is the metallization step, a view B corresponding to zone B of the device of FIG. 3.
Figure 24:
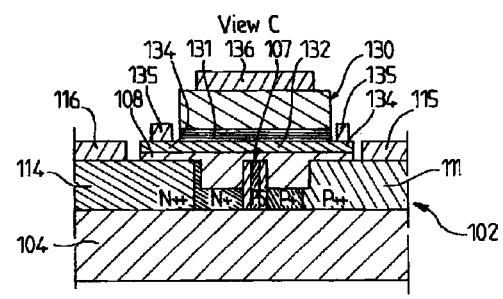
FIG. 24 partially represents, at the seventh step of the fabrication of the other embodiment of a tunable laser source, that is the metallization step, a view C corresponding to zone C of the device of FIG. 1.

Finally, in FIGS. 22, 23 and 24, a metallization 136 is deposited on the top of the component 130 to form the anode and metallizations 135 are deposited on the two wings 134 to form the cathode of the optical component 130.

Likewise a metallization 115 is deposited on the doped zone 111 and a metallization 116 on the doped zone 114 of the silicon layer 105, after eliminating the layer 108 at this location, to form the anode and the cathode of the optical component 102.

Thus, during operation, a first electrical drive signal applied between the anode 136 and the cathode 135 of the optical component 130 makes it possible to control the optical power emitted, while a second electrical drive signal applied between the anode 115 and the cathode 116 of the optical component 102 makes it possible to independently control the optical wavelength emitted in single-mode operation.

Figure 27:
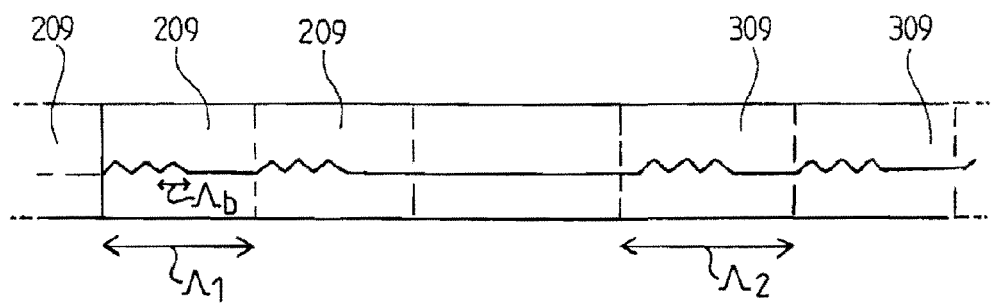
FIG. 27 is a longitudinal sectional schematic representation of a waveguide furnished with two sampled gratings having different periods.

In embodiments, the diffraction grating 9 made in the waveguide 2 may exhibit more complex structures. In the example illustrated in FIG. 27, the diffraction grating 9 is made in the form of two sampled gratings of different sampling periods $\Lambda_1$ and $\Lambda_2$. A sampled grating comprises a certain number of periodic zones 209 and 309 corresponding to the respective sampling period. In the periodic zones 209 and 309, each sampled grating is etched solely over a portion of the length of the period, with a shorter spatial period, termed the Bragg length $\Lambda_b$ which may be the same in the two sampled gratings.

Figure 26:
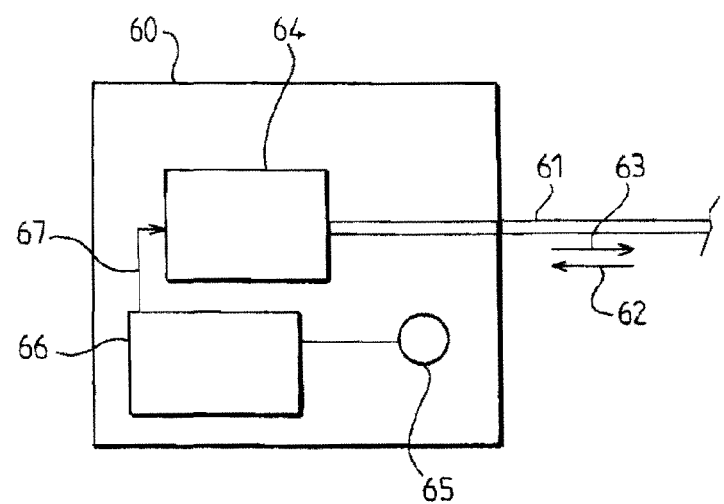
FIG. 26 is a functional schematic representation of an optical communication terminal according to an embodiment.

The laser sources described hereinabove can be employed in diverse optical communication apparatuses. The simplicity of the control of these sources makes it possible to deploy them in particular in apparatuses intended for the general public at a moderate cost. With reference to FIG. 26, a communication terminal 60 of a passive optical network, which may be used for example in a residential application, has been schematically represented. The terminal 60 is linked to an optical fiber 61 on which it receives a downgoing signal 62 from a communication center and it emits an upgoing signal 63 at another wavelength toward the communication center (not represented).

To produce the upgoing signal 63, the terminal 60 comprises a tunable laser source 64, made for example as described above, and other components, not represented, such as modulator/demodulator, electronic card, electrical interfaces etc. To stabilize the emission wavelength of the laser source 64 over time, a temperature sensor 65 and a drive unit 66 are envisaged. The drive unit 66 utilizes the temperature measurement to correct over time the control signal 67 applied between the anode and the cathode of the optical guide fabricated from silicon on insulator, so as to compensate the thermal drift of the emitted wavelength.

Although the invention has been described in conjunction with several particular embodiments, it is very obvious that it is in no way limited thereto and that it comprises all the technical equivalents of the means described as well as their combinations if the latter enter within the framework of the invention.

Certain of the elements represented, in particular the drive units, may be embodied in various forms, in a unitary or distributed manner, by means of hardware and/or software components. Usable hardware components are ASIC application specific integrated circuits, FPGA programmable logic arrays or microprocessors. Software components may be written in various programming languages, for example C, C++, Java or VHDL. This list is not exhaustive.

The use of the verb "comprise", or "include" and of its conjugated forms does not exclude the presence of other elements or of other steps than those recited in a claim. The use of the indefinite article "a" or "an" for an element or a step does not exclude, unless stated otherwise, the presence of a plurality of such elements or steps.

In the claims, any reference sign between parentheses shall not be interpreted as a limitation of the claim.

The invention claimed is:

1. A wavelength tunable laser emission device (1), comprising:
a first waveguide (31, 131) comprising an optical amplification means for producing a stimulated light emission, the first waveguide extending in a longitudinal direction of the emission device,
a second waveguide (5, 105) made of silicon on silicon dioxide and disposed parallel to the first waveguide spaced from the first waveguide in a vertical direction of the emission device so as to allow the existence of a hybrid optical mode coupled at one and the same time to the second waveguide and to the first waveguide, the second waveguide comprising a distributed reflector (9, 109) along the second waveguide beneath the first waveguide, the second waveguide comprising transverse zones (11, 12, 13, 14; 111, 112, 113, 114, 46, 47, 48) doped differently so as to form a polar junction oriented in a transverse direction of the emission device,
first electrodes (35, 36; 135, 136) coupled to the first waveguide for injecting a pumping current into the optical amplification means, and
second electrodes (15, 16; 115, 116) coupled to the doped transverse zones of the second waveguide so as to modify an effective index of the second waveguide seen by the hybrid optical mode.

2. The device as claimed in claim 1, in which the first waveguide (31, 32, 33) is made of an active material from group III-V.

3. The device as claimed in claim 1, in which a silicon dioxide layer (8, 108) of small thickness is disposed between the second waveguide and the first waveguide, the silicon dioxide layer (8, 108) of small thickness exhibiting a thickness of less than 100 nm.

4. The device as claimed in claims 1, in which the polar junction (11, 12, 13, 14) is of P—N type.

5. The device as claimed in claim 1, in which the polar junction (111, 112, 113, 114, 46, 47, 48) is of P—I—P—I—N type.

6. The device as claimed in claim 1, in which the polar junction comprises a first external transverse zone (11, 111) strongly doped positively and a second external transverse zone (14, 114) strongly doped negatively, the second electrodes being disposed respectively on the two strongly doped external transverse zones.

7. The device as claimed in claim 1, in which the distributed reflector (9, 109) exhibits a coupling coefficient of between 10 cm$^{-1}$ and 200 cm$^{-1}$.

8. The device as claimed in claim 1, in which the second waveguide (5, 105) made of silicon on silicon dioxide exhibits a thickness of between 400 nm and 600 nm.

9. The device as claimed in claim 1, in which the distributed reflector (9, 109) is periodic.

10. The device as claimed in claim 1, in which the second waveguide (5, 105) comprises two sampled gratings, each sampled grating comprising a plurality of periodic zones (209, 309) corresponding to a spatial sampling period ($\Lambda_1$, $\Lambda_2$), which is different in the two sampled gratings and, in each of the periodic zones (209, 309), the sampled grating being etched solely over a portion of the length of the sampling period ($\Lambda_1$, $\Lambda_2$), with a shorter spatial period ($\Lambda_b$) than the sampling period.

11. The device as claimed in claim 1, furthermore comprising an optical reflector element (23) arranged at a longitudinal end of the device.

12. The device as claimed in claim 1, in which the second waveguide comprises an extraction zone (37) for radiating the light of the hybrid optical mode out of the laser emission device.

13. An optical communication terminal (60) comprising:
a tunable laser emission device (64) as claimed in claim 1 for generating a monochromatic optical carrier signal,
an optical modulator for modulating a data signal on the carrier signal,
a temperature sensor (65), and
a wavelength stabilization module (66) coupled to the second electrodes of the laser emission device (64) to apply an electrical control signal in the second waveguide, the wavelength stabilization module being able to produce the control signal as a function of a measurement signal of the temperature sensor so as to compensate a thermal drift of the wavelength of the optical carrier signal.

14. A fabrication process for fabricating a wavelength tunable laser emission device, the process comprising:
making a second monolithic optical component (20, 102) comprising a second waveguide (5, 105) made of silicon on silicon dioxide and extending in a longitudinal direction of the second monolithic optical component, the second waveguide comprising a distributed reflector (9, 109) along the second waveguide, the second waveguide comprising transverse zones (11, 12, 13, 14; 111, 112, 113, 114, 46, 47, 48) doped differently so as to form a polar junction oriented in a transverse direction of the second optical component, the second monolithic optical component comprising a superficial layer (8, 108) of silicon dioxide of small thickness covering the second waveguide at an upper surface of the second optical component,
adhesively bonding a first monolithic optical component (30, 130) made of materials from group III-V on the upper surface (51) of the second optical component, the first monolithic optical component comprising a light-amplifying guiding layer (31, 131), making a first waveguide in the first monolithic optical component, the first waveguide being made in an aligned manner by lithography with the second waveguide,
forming on the first monolithic optical component first electrodes (35, 36; 135, 136) for controlling the optical amplification gain, and
forming on the second monolithic optical component second electrodes (15, 16; 115, 116) coupled to the doped transverse zones of the second waveguide so as to modify an effective index of the second waveguide.

15. The process as claimed in claim 14, in which the adhesive bonding of the first monolithic optical component (30, 130) on the upper surface of the second optical component (2, 102) is carried out by pressurization, preferably with the aid of a polymer adhesive.

16. The device as claimed in claim 2, in which a silicon dioxide layer (8, 108) of small thickness is disposed between the second waveguide and the first waveguide, the silicon dioxide layer (8, 108) of small thickness exhibiting a thickness of less than 100 nm.

* * * * *